(12) United States Patent
Inoue et al.

(10) Patent No.: US 8,895,405 B2
(45) Date of Patent: Nov. 25, 2014

(54) METHOD FOR MANUFACTURING A SEMICONDUCTOR DEVICE

(75) Inventors: Fumihiko Inoue, Aizuwakamatsu (JP); Yukio Hayakawa, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/963,415

(22) Filed: Dec. 21, 2007

(65) Prior Publication Data

US 2008/0166853 A1    Jul. 10, 2008

(30) Foreign Application Priority Data

Dec. 28, 2006  (JP) ................. 2006-355024

(51) Int. Cl.
*H01L 21/76*    (2006.01)
*H01L 21/31*    (2006.01)
*H01L 21/469*   (2006.01)

(52) U.S. Cl.
USPC ............................ 438/424; 438/435; 438/437

(58) Field of Classification Search
USPC ................. 438/221, 248, 294–296, 359, 391, 438/424–438
See application file for complete search history.

(56) References Cited

U.S. PATENT DOCUMENTS

| | | | | |
|---|---|---|---|---|
| 4,952,524 A * | 8/1990 | Lee et al. | ....................... | 438/437 |
| 5,521,422 A * | 5/1996 | Mandelman et al. | ......... | 257/510 |
| 6,682,985 B2 * | 1/2004 | Yuzuriha et al. | .............. | 438/425 |
| 6,953,727 B2 * | 10/2005 | Hori | .............................. | 438/275 |
| 2002/0081818 A1 * | 6/2002 | Teramoto et al. | ............. | 438/424 |
| 2003/0124813 A1 * | 7/2003 | Lee | ................. | 438/400 |
| 2005/0255668 A1 * | 11/2005 | Tseng et al. | .................. | 438/424 |
| 2006/0014362 A1 * | 1/2006 | Lee | ................. | 438/435 |
| 2006/0148197 A1 * | 7/2006 | Wu et al. | ....................... | 438/424 |

* cited by examiner

*Primary Examiner* — Yasser A Abdelaziez
*Assistant Examiner* — Cory Eskridge

(57) ABSTRACT

A method of manufacturing a semiconductor device includes forming a silicon nitride film having an opening portion on a semiconductor substrate, forming a silicon oxide film on the silicon nitride film and on a side face of the opening portion, performing an etching treatment to the silicon oxide film so that a sidewall is formed on the side face of the opening portion, forming a trench on the semiconductor substrate with use of the sidewall and the silicon nitride film as a mask, and forming an insulating layer in the trench. The step of forming the silicon oxide film includes oxidizing the silicon nitride film with a plasma oxidation method or a radical oxidation method.

8 Claims, 9 Drawing Sheets

METHOD FOR MANUFACTURING A SEMICONDUCTOR DEVICE

TECHNICAL FIELD

This invention generally relates to a method for manufacturing a semiconductor device, and in particular, relates to a method for manufacturing a semiconductor device having an element separation region using a shallow trench isolation (STI) method.

BACKGROUND OF THE INVENTION

Figure 1A:
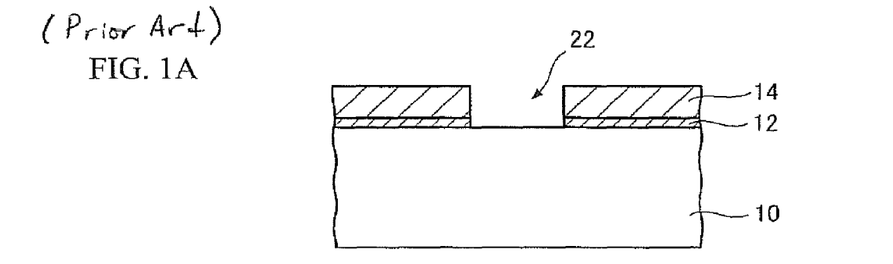
FIG. 1A through FIG. 1D illustrate a cross sectional view accounting for a method of manufacturing a semiconductor device in accordance with a first conventional embodiment.

A Shallow Trench Isolation (STI) method is used as an element separation method in a semiconductor device for the purpose of high integration therein. FIGS. 1A through 1D illustrate cross sectional views accounting for element separation by an STI method in accordance with a first conventional embodiment. As shown in FIG. 1A, a pad oxide film 12 and a silicon nitride film 14 are formed on a silicon semiconductor substrate 10. An opening portion 22 is formed in a region of the pad oxide film 12 and the silicon nitride film 14 where a trench is to be formed in the substrate 10.

Figure 1B:
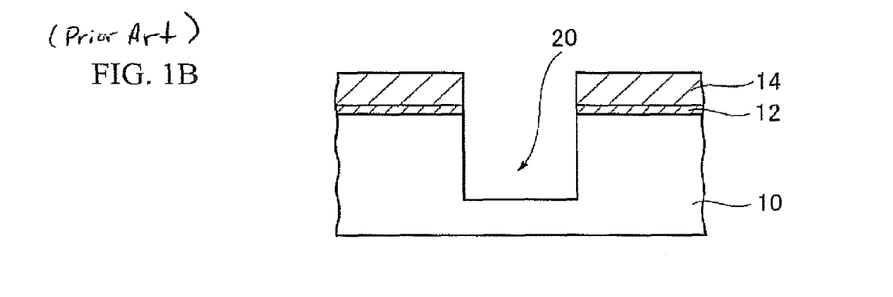
Figure 1C:
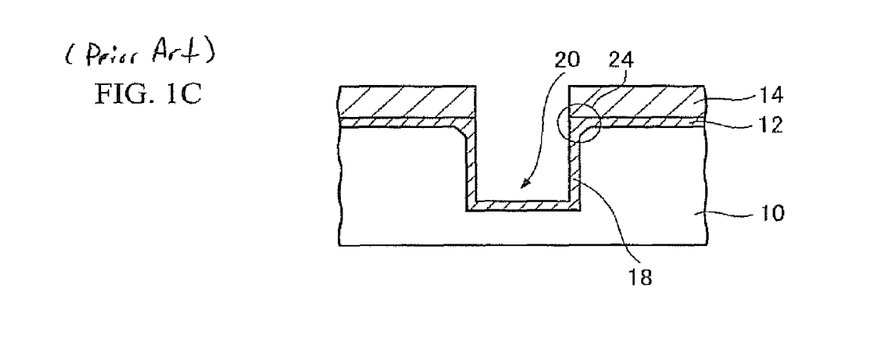
Figure 1D:
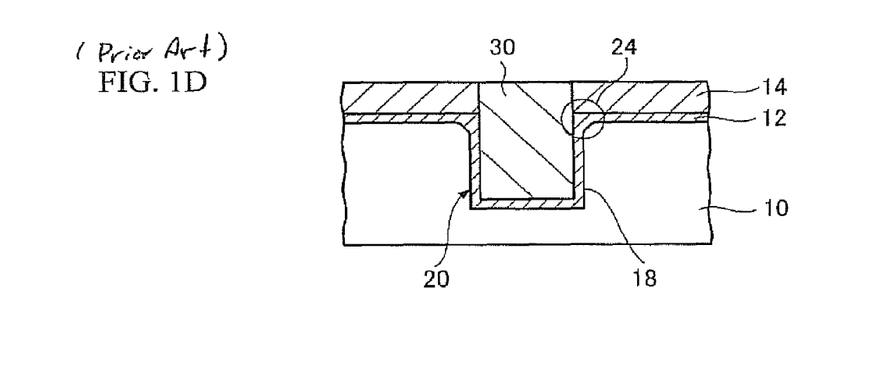

As shown in FIG. 1B, the semiconductor substrate 10 is subjected to an etching process using the silicon nitride film 14 as a mask, and a trench 20 is formed in the semiconductor substrate 10. As shown in FIG. 1C, the semiconductor substrate 10 inside the trench 20 is oxidized by thermal oxidation, and a trench oxide film 18 connecting to the pad oxide film 12 is formed. As shown in FIG. 1D, a silicon oxide film acting as an insulating film 30 is formed on the trench oxide film 18 in the trench 20.

Figure 2A:
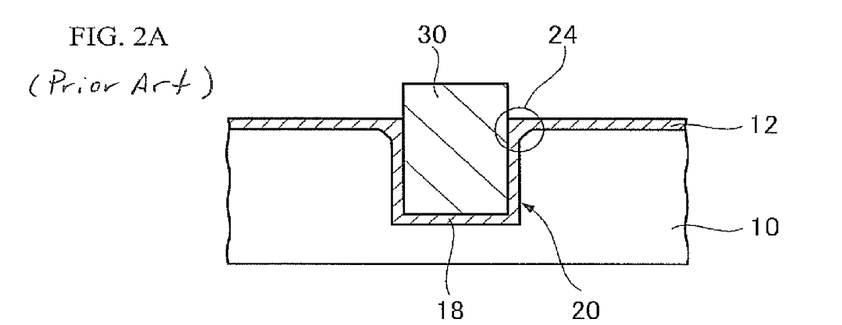
FIG. 2A and FIG. 2B illustrate a cross sectional view accounting for the method of manufacturing the semiconductor device in accordance with the first conventional embodiment.
Figure 2B:
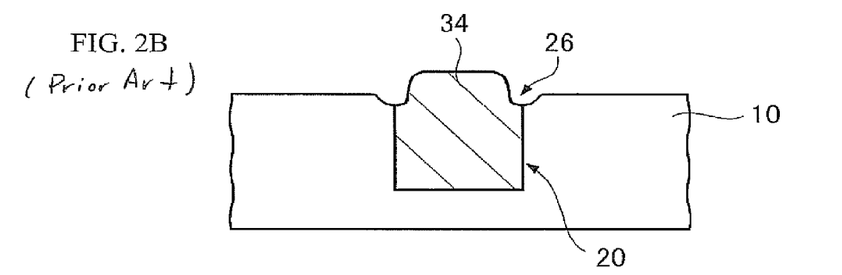

As shown in FIG. 2A, the silicon nitride film 14 is removed and, as shown in FIG. 2B, the pad oxide film 12 is also removed with an overall etching process. When the pad oxide film 12 is etched, an upper portion of the insulating film 30 is also etched. Thus, an insulating layer 34 implanted in the trench 20 is formed from the trench oxide film 18 and the insulating film 30, thereby enabling a STI separation.

In the first conventional embodiment, in FIG. 1C, there may be generated a bird's beak on the trench 20 side at an interface between the silicon nitride film 14 and the semiconductor substrate 10 during the formation of the trench oxide film 18. As a result, a face of the semiconductor substrate 10 at the upper portion of the trench 20 may be inclined, as is case of a region 24. And as shown in FIG. 2B, an end portion of the insulating layer 34 and an end portion of the trench 20 in which the bird's beak is generated are overlapped with each other during the formation of the insulating layer 34 of the STI. And, the etching may be performed in a horizontal direction, because the pad oxide film 12 is removed with an isotropic etching. There may be formed a recess 26 composed of the semiconductor substrate 10 and the insulating layer 34.

Figure 3:
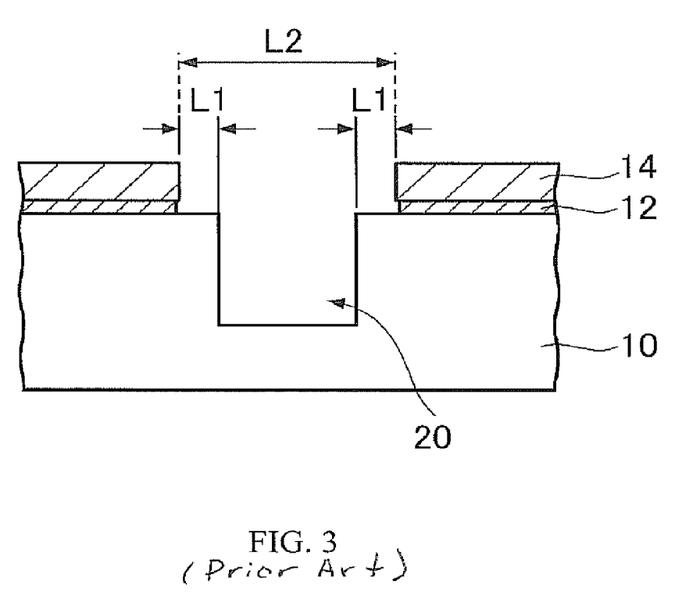
FIG. 3 illustrates a problem of a method of manufacturing a semiconductor device disclosed in Document 1.

An art is disclosed below in order to restrain a formation of the recess 26 in the first conventional embodiment. Japanese Patent Application Publication No. 11-145275 (hereinafter referred to as Document 1) discloses an art where the semiconductor substrate 10 is immersed in HF (hydrofluoric acid)/glycerol after the process of FIG. 1C and the silicon nitride film 14 is subjected to a side etching treatment as shown in FIG. 3. U.S. Pat. No. 5,521,422 (hereinafter referred to as Document 2) discloses an art where a sidewall composed of a silicon oxide film is formed on a side face of the opening portion 22 of the silicon nitride film 14 with a CVD method after the process of FIG. 1A.

In the art disclosed in Document 1, an etching speed of HF/glycerol with respect to the silicon nitride film 14 is large, being 4.1 nm/minute. It takes very small time, 2.4 minutes, to etch a silicon nitride film having a thickness of 10 nm. There may be variability in side etching amount L1 of the silicon nitride film 14 shown in FIG. 3 in a wafer or between wafers treated at a time. Controllability is not good when the silicon nitride film 14 is subjected to the side etching treatment, because the silicon nitride film 14 is side-etched and is backward. That is, there is a problem that controllability of a length L2 between each of the silicon nitride films 14 is not good.

Figure 4A:
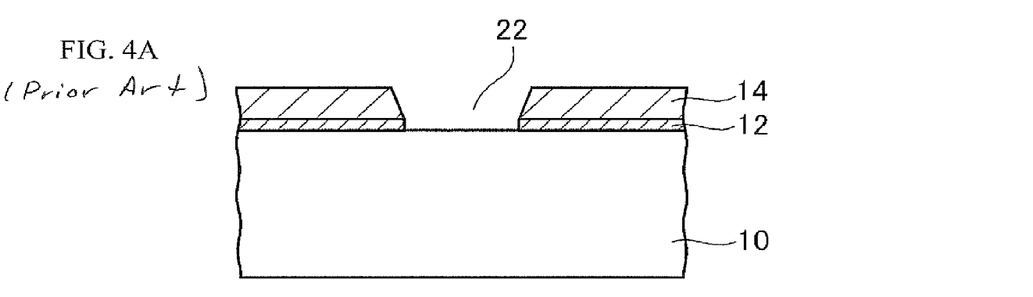
FIG. 4A through FIG. 4C illustrate a problem of a method of manufacturing a semiconductor device disclosed in Document 2.
Figure 4B:
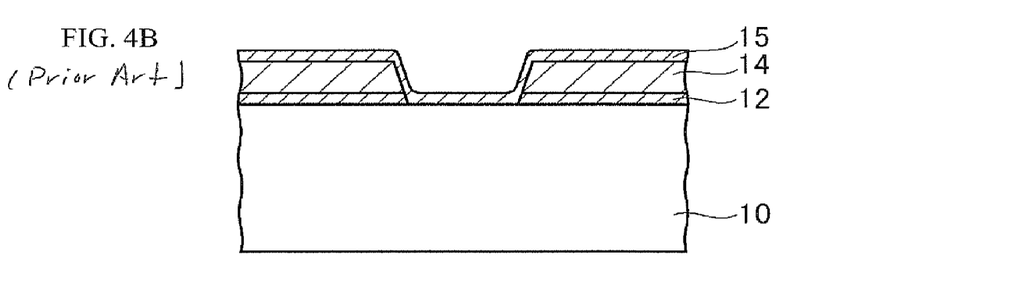
Figure 4C:
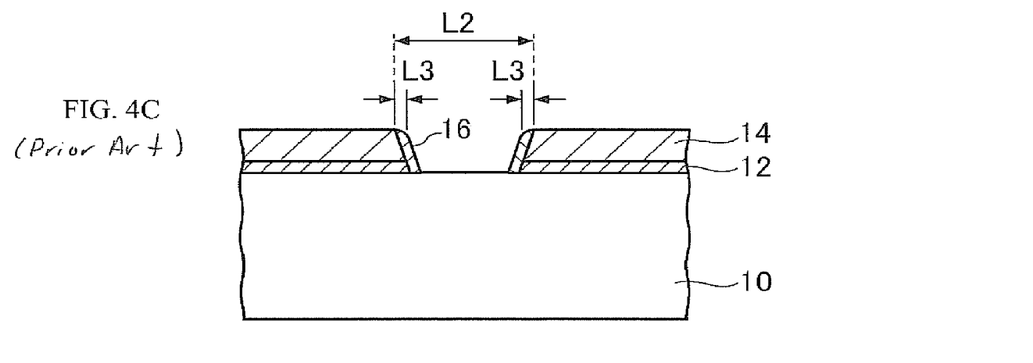

On the other hand, there is a problem with respect to the art disclosed in Document 2. FIG. 1A illustrates the side face of the opening portion 22 of the silicon nitride film 14 being vertical to the surface of the semiconductor substrate 10. In actual, it is difficult that the silicon nitride film 14 is etched vertically. The side face of the opening portion 22 of the silicon nitride film 14 is therefore formed to be oblique to the surface of the semiconductor substrate 10 as shown in FIG. 4A. A silicon oxide film 15 may be formed so as to have a small thickness on the side face of the opening portion 22 as shown in FIG. 4B, if the silicon oxide film 15 is formed on the oblique silicon nitride film 14 with a CVD method. A width L4 of a sidewall 16 is therefore reduced as shown in FIG. 4C. There may be variability in an inclination of the side face of the opening portion 22 of the silicon nitride film 14 from the surface of the semiconductor substrate 10, in the wafer or between the wafers. There may be variability in the thickness of the silicon oxide film 15 on the side face of the opening portion 22. Further, there may be large variability in formation speed of the silicon oxide film 15 with respect to the CVD method. There may be larger variability in the thickness of the silicon oxide film 15 on the side face of the opening portion 22. The variability of the width L4 is larger in the wafer or between the wafers, if the sidewall 16 is formed as shown in FIG. 4C. That is, the controllability of a distance L2 between each of the silicon nitride films 14 is degraded.

As mentioned above, in the art disclosed in Document 1 and Document 2, the controllability of the distance L2 between each of the silicon nitride films 14 is not good. The controllability of the width of the insulating layer 34 of the STI may get worse if the controllability of the distance L2 between each of the silicon nitride films 14 is not good.

SUMMARY OF THE INVENTION

The present invention provides a method of manufacturing a semiconductor device that restrains a formation of a recess of a trench and obtains a controllability of a width of an insulating layer of the STI.

According to an aspect of the present invention, preferably, there is provided a method of manufacturing a semiconductor device including forming a silicon nitride film having an opening portion on a semiconductor substrate, forming a silicon oxide film on the silicon nitride film and on a side face of the opening portion, performing an etching treatment to the silicon oxide film so that a sidewall is formed on the side face of the opening portion, forming a trench on the semiconductor substrate with use of the sidewall and the silicon nitride film as a mask, and forming an insulating layer in the trench. The step of forming the silicon oxide film includes oxidizing the silicon nitride film with a plasma oxidation method or a radical oxidation method. With the method, it is possible to restrain a formation of the trench and improve a controllability of a width of the insulating layer.

According to another aspect of the present invention, preferably, there is provided a method of manufacturing a semiconductor device including forming a silicon nitride film and a first silicon oxide film having an opening portion on a semiconductor substrate, forming a second silicon oxide film on an upper face of the first silicon oxide film and on a side face of the opening portion, performing an etching treatment to the first silicon oxide film so that the first silicon oxide film on the silicon nitride film is left and forming a sidewall on the side face of the opening portion, forming a trench on the semiconductor substrate with use of the sidewall and the silicon nitride film as a mask, and forming an insulating layer in the trench. With the method, it is possible to restrain a formation of the trench and improve a controllability of a width or a shape of the trench.

DETAILED DESCRIPTION OF THE INVENTION

A description will now be given of best modes for carrying out the present invention.

First Embodiment

Figure 5A:
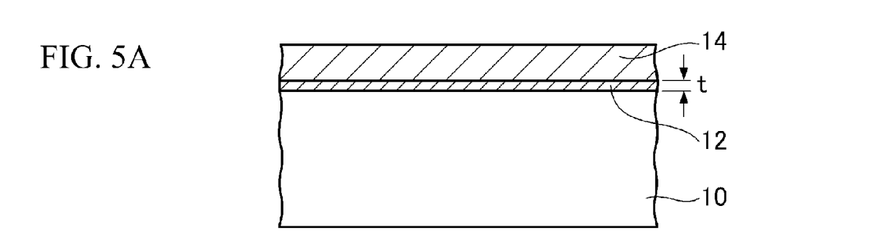
FIG. 5A through FIG. 5E illustrate a method of manufacturing a semiconductor device in accordance with a first embodiment.

A description will be given of a method of manufacturing a semiconductor device in accordance with a first embodiment, with reference to FIG. 5A through FIG. 6D. As shown in FIG. 5A, the pad oxide film 12 having thickness t is formed on a silicon semiconductor substrate 10 with thermal oxidation method or the like. The thickness t is, for example, approximately 3 nm to 5 nm. The silicon nitride film 14 is formed on the pad oxide film 12 with a LP-CVD method or the like. Thickness of the silicon nitride film 14 is, for example, approximately 100 nm.

Figure 5B:
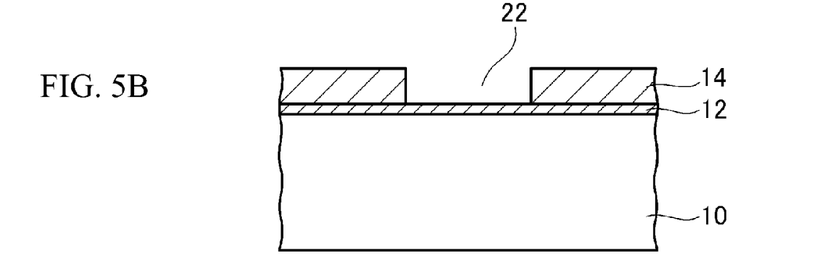

As shown in FIG. 5B, a given region of the silicon nitride film 14 is subjected to an etching treatment with use of exposure technology and etching technology. And the opening portion 22 is formed so as to have width of, for example, 100 nm. With the process, there is formed the silicon nitride film 14 having an opening portion on the semiconductor substrate 10.

Figure 5C:
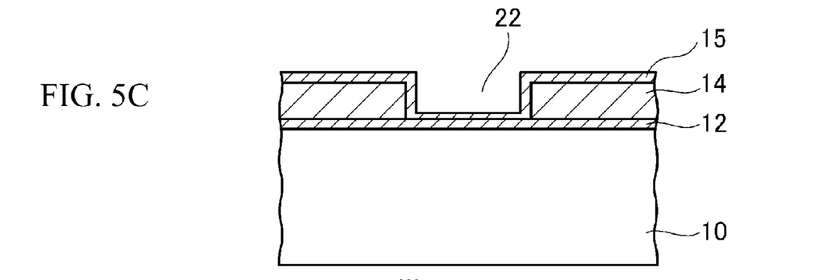
Figure 5D:
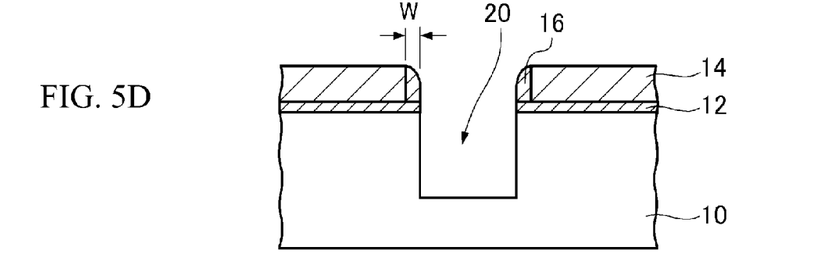
Figure 5E:
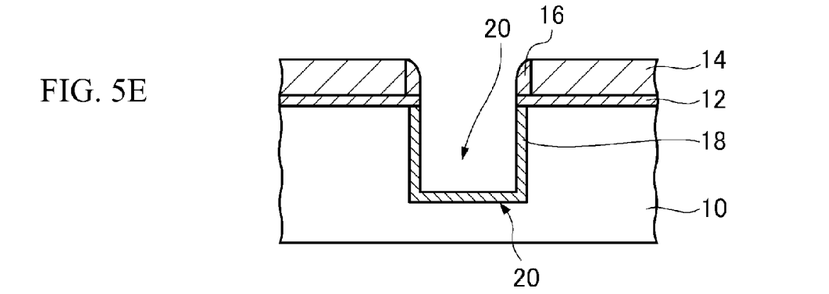

As shown in FIG. 5C, the silicon oxide film 15 is formed on an upper face of the silicon nitride film 14 and on a side face of the opening portion 22 with a plasma oxidation method at, for example, 400 degrees C. As shown in FIG. 5D, the silicon oxide film 15 is subjected to an overall etching treatment. And there is formed a sidewall 16 having thickness W of, for example, 10 nm in a width direction thereof on the side face of the opening portion 22. The semiconductor substrate 10 is etched by for example 300 nm with use of the silicon nitride film 14 and the sidewall 16 as a mask. And the trench 20 is formed. As shown in FIG. 5E, a bottom face and a side face of the trench 20 are subjected to a thermal oxidation treatment, and the trench oxide film 18 is formed.

Figure 6A:
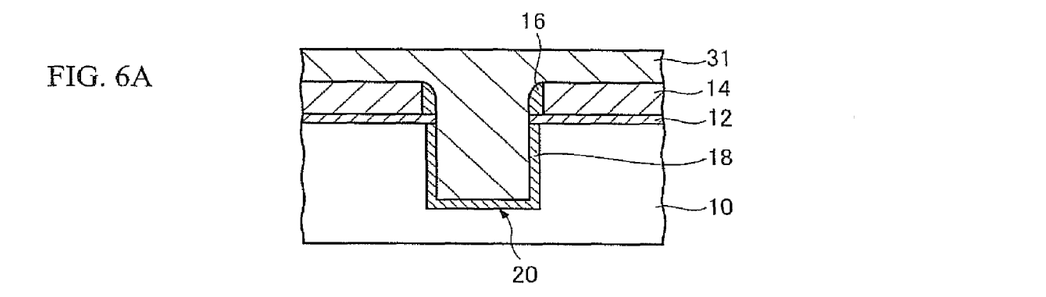
FIG. 6A through FIG. 6D illustrate the method of manufacturing the semiconductor device in accordance with the first embodiment.
Figure 6B:
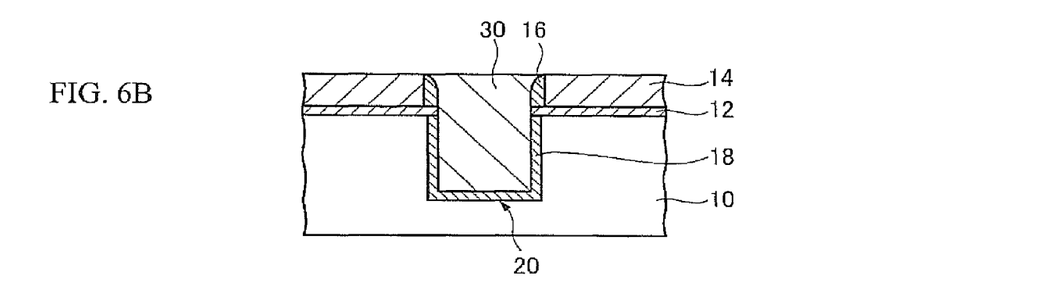

As shown in FIG. 6A, a silicon oxide film acting as an insulating film 31 is formed on the trench oxide film 18 in the trench 20 and on the silicon nitride film 14 with a high density plasma CVD or the like so that the trench 20 is implanted. As shown in FIG. 6B, the insulating film 31 on the silicon nitride film 14 is polished with a CMP method. Thus, there is formed the insulating film 30 in the trench 20 and between the sidewalls 16.

Figure 6C:
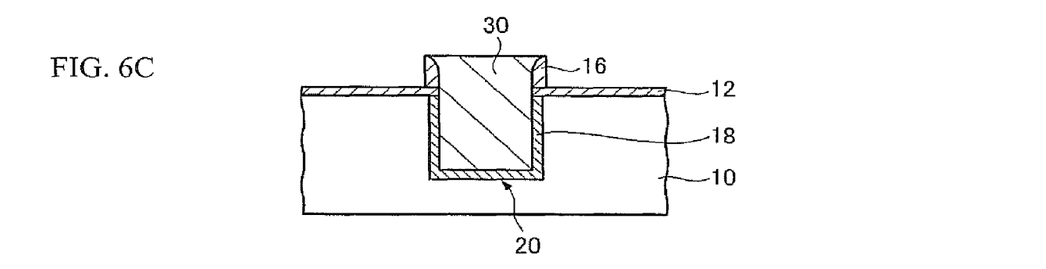
Figure 6D:
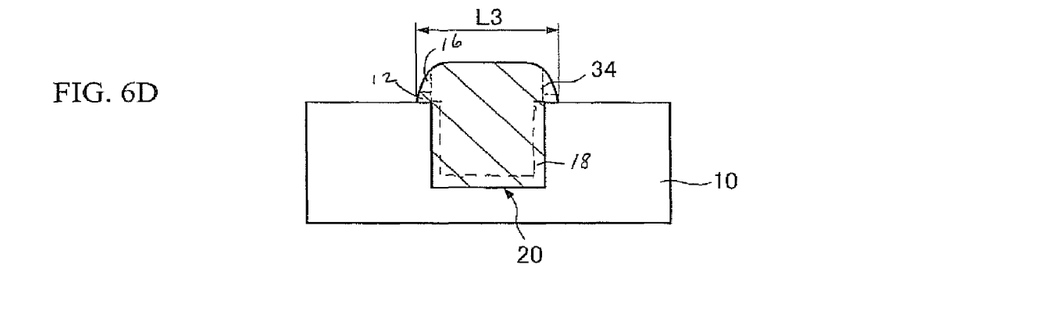

As shown in FIG. 6C, the silicon nitride film 14 is removed with phosphoric acid or the like. As shown in FIG. 6D, the pad oxide film 12 is removed with an overall etching using HF aqueous solution. In this case, an upper portion of the insulating film 30 is etched. Therefore, there is formed the insulating layer 34 implanted in the trench 20 from the trench oxide film 18 and the insulating film 30, and an STI is formed.

Figure 7A:
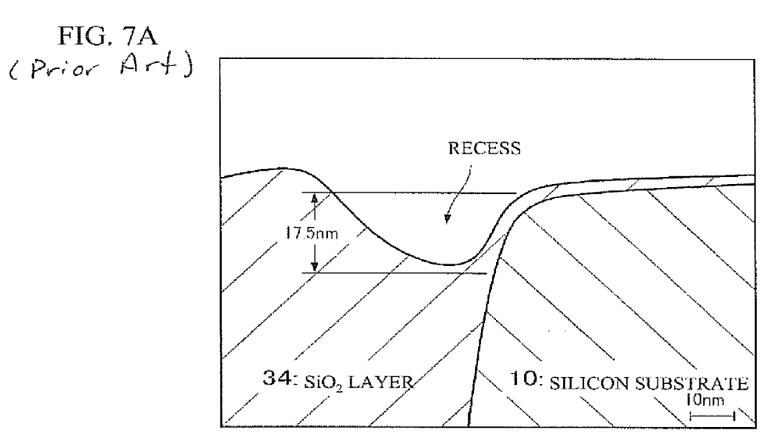
FIG. 7A illustrates a schematic SEM picture of a cross sectional view of a semiconductor device manufactured with the method in accordance with the first conventional embodiment.
Figure 7B:
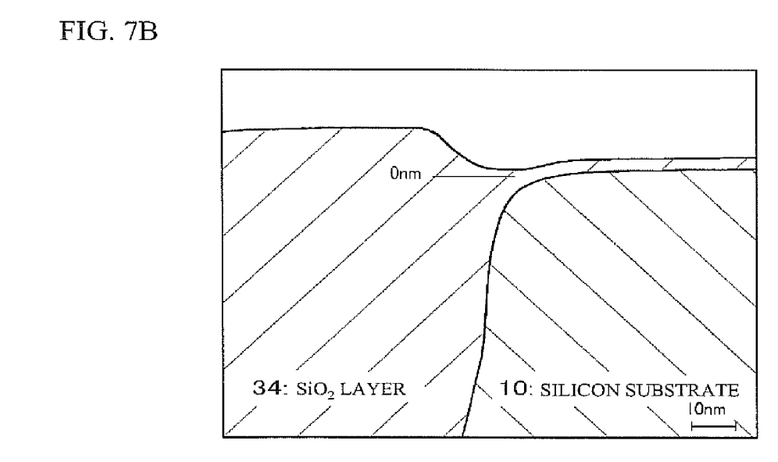
FIG. 7B illustrates a schematic SEM picture of a cross sectional view of a semiconductor device manufactured with the method in accordance with the first embodiment.

FIG. 7A illustrates a schematic view of a SEM picture around an interface between the semiconductor substrate 10 and the insulating layer 34 having the STI structure manufactured with the manufacturing method in accordance with the first conventional embodiment. A recess having a depth of approximately 17.5 nm is formed on the surface around the interface between the semiconductor substrate 10 and the insulating layer 34. On the other hand, FIG. 7B illustrates a schematic view of a SEM picture around an interface between the semiconductor substrate 10 and the insulating layer 34 having the STI structure manufactured with the manufacturing method in accordance with the first embodiment. There are few recesses on the surface around the interface between the semiconductor substrate 10 and the insulating layer 34. This is because an end portion of the trench 20 and an end portion of the insulating layer 34 are formed so as to be off each other because of the sidewall 16 when the pad oxide film 12 is subjected to the etching treatment, as shown in FIG. 6D.

In FIG. 5C, the silicon oxide film 15 is formed with a plasma oxidation method. With the plasma oxidation method, it is possible to form the silicon oxide film 15 evenly on the side face and the upper face of the silicon nitride film 14. It is therefore possible to restrain a variability of width of the silicon oxide film 15 on the side face of the opening portion 22 as disclosed in Document 2, because of inclination of the side face of the opening portion 22 of the silicon nitride film 14. And it is possible to improve controllability of the thickness of the silicon oxide film 15 with the plasma oxidation method, compared to a CVD method. It is therefore possible to improve controllability of a width L3 of the insulating layer 34 in FIG. 6D. And it is possible to form the silicon oxide film 15 evenly on the side face and the upper face of the silicon nitride film 14, with a radical oxidation method. Accordingly, the silicon oxide film 15 shown in FIG. 5C may be formed with the radical oxidation method instead of the plasma oxidation method.

If the pad oxide film 12 shown in FIG. 6C is subjected to an etching treatment using HF aqueous solution as shown in the first embodiment, the etching is isotropic one. And so, the thickness W of the sidewall 16 shown in FIG. 5D in the width direction thereof is set to be larger than the thickness t of the pad oxide film 12 shown in FIG. 5A. This overlaps the end portion of the insulating layer 34 and the end portion of the trench 20 with each other and prevents a recess like the recess 26 as shown in FIG. 2B of the first conventional embodiment from being formed.

Second Embodiment

Figure 8A:
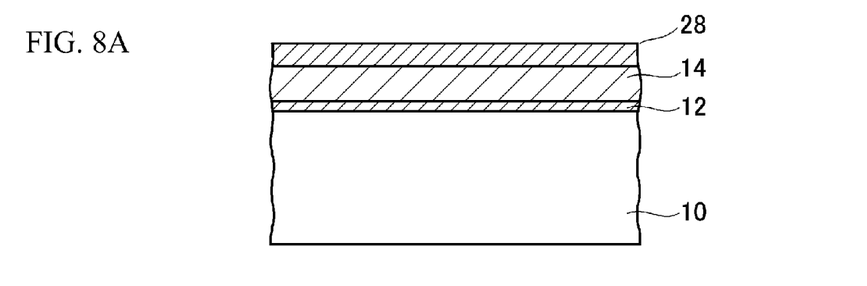
FIG. 8A through FIG. 8D illustrate a method of manufacturing a semiconductor device in accordance with a second embodiment.

Second embodiment is a case where a first silicon oxide film 28 is formed on the silicon nitride film 14. A description will be given of a method of manufacturing a semiconductor device in accordance with the second embodiment, with reference to FIG. 8A through FIG. 9D. As shown in FIG. 8A, the first silicon oxide film 28 is formed on the silicon nitride film 14 with a CVD method, a plasma oxidation method or the like, after the pad oxide film 12 and the silicon nitride film 14 are formed on the semiconductor substrate 10 as in the case of FIG. 5A of the first embodiment.

Figure 8B:
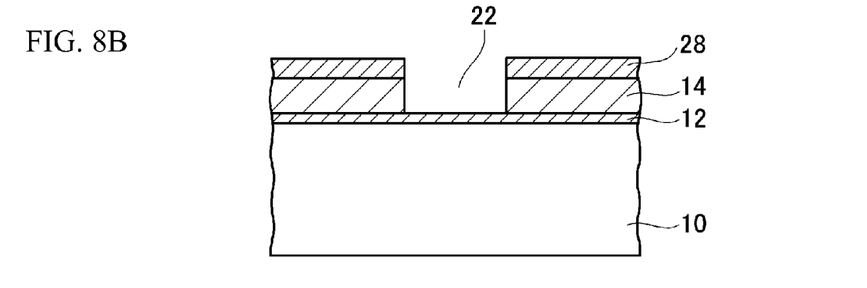
Figure 8C:
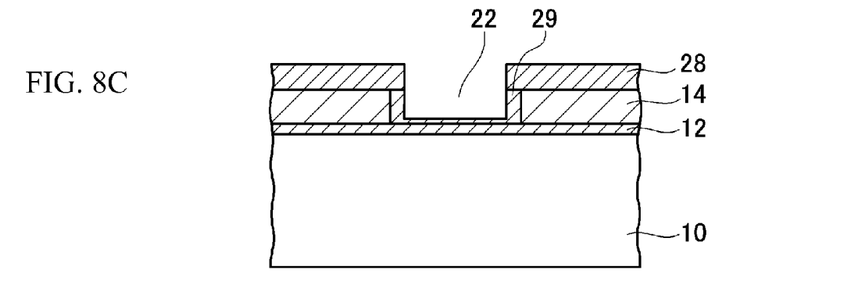

As shown in FIG. 8B, the opening portion 22 is formed in the first silicon oxide film 28 and the silicon nitride film 14. As shown in FIG. 8C, the side face of the opening portion 22 of the silicon nitride film 14 is oxidized with a plasma oxidation method and a second silicon oxide film 29 is formed. In this case, the thickness of the first silicon oxide film 28 on the silicon nitride film 14 and the thickness of the pad oxide film 12 on the bottom face of the opening portion 22 are slightly increased.

Figure 8D:
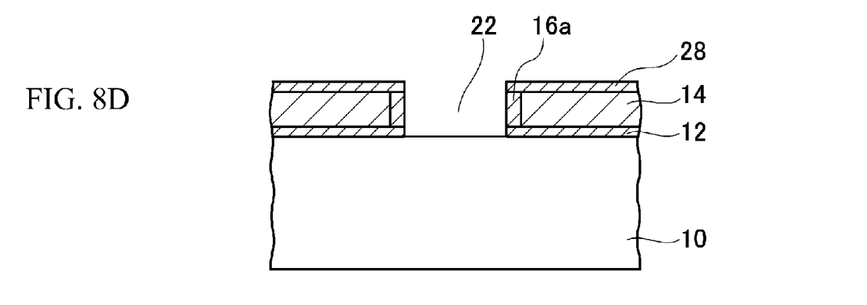

As shown in FIG. 8D, the first silicon oxide film 28 is subjected to an overall anisotropic etching treatment so that the first silicon oxide film 28 is left on the silicon nitride film 14. And a sidewall 16a is formed on the side face of the opening portion 22 of the silicon nitride film 14 from the second silicon oxide film 29 that is shown in FIG. 8C. It is possible to form the side face of the sidewall 16a so as to be more vertical if the sidewall 16a is formed in this way.

Figure 9A:
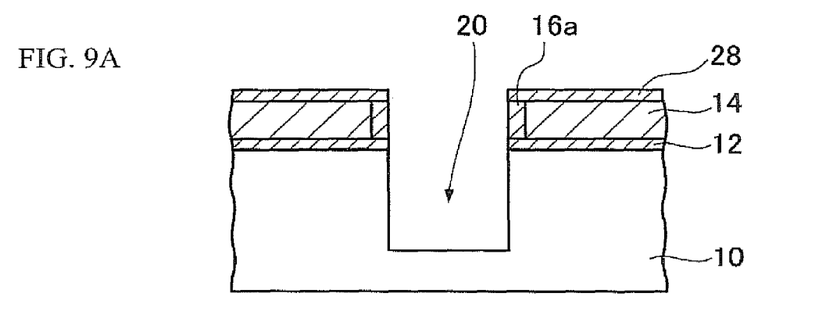
FIG. 9A through FIG. 9C illustrate the method of manufacturing the semiconductor device in accordance with the second embodiment.
Figure 9B:
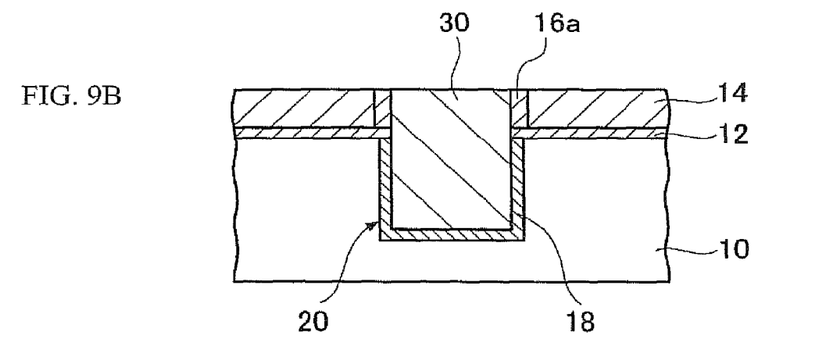
Figure 9C:
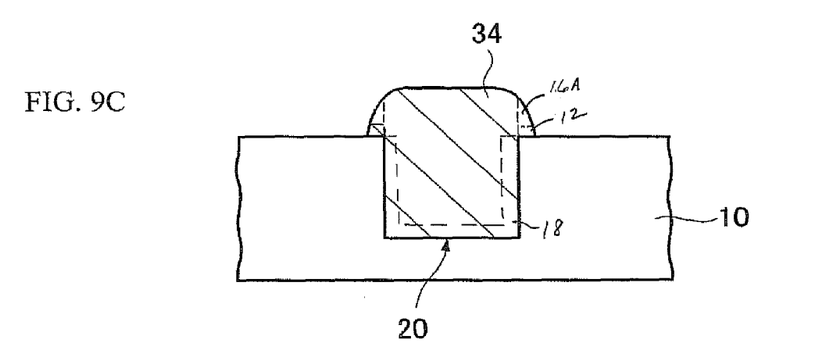

As shown in FIG. 9A, the trench 20 is formed in the semiconductor substrate 10 with use of the first silicon oxide film 28 as a mask. As shown in FIG. 9B, the insulating film 30 is formed in the trench 20, as is in the case of FIG. 5D through FIG. 6B in the first embodiment. In this case, the first silicon oxide film 28 is removed during the polishing. As shown in FIG. 9C, the silicon nitride film 14 and the pad oxide film 12 are removed, as is in the case of FIG. 6C and FIG. 6D of the first embodiment. And the insulating layer 34 is formed in the trench 20.

In accordance with the second embodiment, as shown in FIG. 8D, the sidewall 16a is formed so that the first silicon oxide film 28 is left on the silicon nitride film 14. It is therefore possible to form the side face of the sidewall 16a more vertical to the semiconductor substrate 10, compared to the first embodiment. The controllability of the width or the shape of the trench 20 may be degraded when the semiconductor substrate 10 shown in FIG. 9A is subjected to the etching treatment and the trench 20 is formed, if the side face of the sidewall 16 is oblique. In the second embodiment, it is possible to improve the controllability of the width or the shape of the trench 20, because the side face of the sidewall 16a is vertical.

Similarly to the second embodiment, it is possible to improve the controllability of the width or the shape of the trench 20 because of the formation of the second silicon oxide film 29 in FIG. 8C, if the CVD method or the like is used. However, it is possible to improve the controllability of the width of the insulating layer 34 with the plasma oxidation method or the radical oxidation method, similarly to the first embodiment.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-355024 filed on Dec. 28, 2006, the entire disclosure of which is hereby incorporated by reference.

We claim:

1. A method for manufacturing a semiconductor device comprising:
    forming a silicon nitride film on a semiconductor substrate, the silicon nitride film having an opening formed in a portion thereof;
    forming a silicon oxide film on the silicon nitride film and on a side face of the opening;
    etching the silicon oxide film so that a sidewall is formed on the side face of the opening;
    forming a trench with vertical and straight sidewalls in the semiconductor substrate using the sidewall and the silicon nitride film as a mask; and
    forming an insulating layer in the trench that comprises a planar curve-less top portion that is parallel with the bottom of the trench, wherein the width of the planar curve-less top portion is less than the width between the vertical and straight sidewalls of the trench that is situated between convex curved portions that extend above and directly contact the semiconductor substrate beyond the left and right sides of the trench,
    wherein the step of forming the silicon oxide film includes the step of oxidizing the silicon nitride film with one of a plasma oxidation method or a radical oxidation method wherein at least a portion of the silicon oxide film forms a permanent part of the semiconductor device.

2. The method in accordance with claim 1 further comprising forming a pad oxide film on the semiconductor substrate.

3. The method in accordance with claim 2, wherein a thickness of the sidewall is larger than a thickness of the pad oxide film.

4. The method in accordance with claim 1 further comprising oxidizing a side face and a bottom face of the trench.

5. A method for manufacturing a semiconductor device comprising:
    forming a silicon nitride film and a first silicon oxide film on a semiconductor substrate, the silicon nitride film and the first silicon oxide film having an opening formed in a portion thereof wherein at least a portion of the first silicon oxide film forms a permanent part of the semiconductor device;
    forming a second silicon oxide film on an upper face of the first silicon oxide film and on a side face of the opening wherein the forming the second silicon oxide film comprises oxidizing the silicon nitride film with one of a plasma oxidation method or a radical oxidation method;
    etching the second silicon oxide film so that the first silicon oxide film on the silicon nitride film is left and forming a sidewall on the side face of the opening;
    forming a trench with vertical and straight sidewalls in the semiconductor substrate using the sidewall and the silicon nitride film as a mask; and
    forming an insulating layer in the trench that comprises a planar curve-less top portion that is parallel to the bottom of the trench, wherein the width of the planar curveless top portion is less than the width between the vertical and straight sidewalls of the trench and that is situated between convex curved portions that extend above and directly contact the semiconductor substrate beyond the left and right sides of the trench.

6. The method in accordance with claim 5 further comprising forming a pad oxide film on the semiconductor substrate.

7. The method in accordance with claim 6, wherein a thickness of the sidewall is larger than a thickness of the pad oxide film.

8. The method in accordance with claim 5 further comprising oxidizing a side face and a bottom face of the trench.

* * * * *